US011827998B2

(12) United States Patent
Wang et al.

(10) Patent No.: US 11,827,998 B2
(45) Date of Patent: Nov. 28, 2023

(54) FACILE ETCHING FOR SINGLE CRYSTAL CATHODE MATERIALS

(71) Applicant: Worcester Polytechnic Institute, Worcester, MA (US)

(72) Inventors: Yan Wang, Acton, MA (US); Xiaotu Ma, Worcester, MA (US); Eric Gratz, Worcester, MA (US); Jinzhao Fu, Worcester, MA (US); Panawan Vanaphuti, Worcester, MA (US)

(73) Assignee: Worcester Polytechnic Institute, Worcester, MA (US)

( * ) Notice: Subject to any disclaimer, the term of this patent is extended or adjusted under 35 U.S.C. 154(b) by 280 days.

(21) Appl. No.: 17/330,922

(22) Filed: May 26, 2021

(65) Prior Publication Data

US 2021/0372001 A1 Dec. 2, 2021

Related U.S. Application Data

(60) Provisional application No. 63/030,414, filed on May 27, 2020.

(51) Int. Cl.
*C30B 1/02* (2006.01)
*C30B 1/12* (2006.01)
(Continued)

(52) U.S. Cl.
CPC .............. *C30B 1/02* (2013.01); *C30B 1/12* (2013.01); *C30B 29/22* (2013.01); *H01M 4/505* (2013.01);
(Continued)

(58) Field of Classification Search
CPC . C30B 1/02; C30B 1/12; C30B 29/22; H01M 10/54; H01M 5/505; H01M 5/525; H01M 2004/028
See application file for complete search history.

(56) References Cited

U.S. PATENT DOCUMENTS 9,834,827 B2 * 12/2017 Wang .................... H01M 4/525
9,972,830 B2    5/2018 Poe et al.
11,127,992 B2 * 9/2021 Wang .................... C22B 7/007

FOREIGN PATENT DOCUMENTS

CN          1450676 A     10/2003
CN        106953132 A      7/2017
(Continued)

OTHER PUBLICATIONS

Ma et al "A universal etching method for synthesizing high performance single crsytal cathod material" Nano energy 87 2021 106194.*
(Continued)

*Primary Examiner* — Robert M Kunemund
(74) *Attorney, Agent, or Firm* — Armis IP Law, LLC

(57) ABSTRACT

A recycling and synthesis of charge material for secondary batteries generates single-crystal charge materials for producing batteries with greater charge cycle longevity. Charge material particles undergo a heating for fusing or enhancing grain boundaries between polycrystalline particles. The resulting, more well-defined grain boundaries are easily etched by a relatively weak mineral acid solution. The acid solution removes material at the grain boundaries to separate secondary particles into primary particles along the grain boundaries. The resulting single crystal (monocrystalline) charge material particles are washed and filtered, and typically re-sintered to accommodate any needed lithium (lithium carbonate), and result in a charge material with larger surface area, higher lithium diffusivity and lower cation ordering.

24 Claims, 7 Drawing Sheets

(51) Int. Cl.
  *C30B 29/22* (2006.01)
  *H01M 4/525* (2010.01)
  *H01M 10/54* (2006.01)
  *H01M 4/505* (2010.01)
  *H01M 4/02* (2006.01)

(52) U.S. Cl.
  CPC .......... *H01M 4/525* (2013.01); *H01M 10/54* (2013.01); *H01M 2004/028* (2013.01)

(56) References Cited

FOREIGN PATENT DOCUMENTS

| | | |
|---|---|---|
| RU | 2088002 C1 | 8/1997 |
| RU | 2108644 C1 | 4/1998 |
| WO | 2010101307 A2 | 9/2010 |
| WO | 2015089060 A1 | 6/2015 |
| WO | 2016001884 A1 | 1/2016 |
| WO | 2017042654 A1 | 3/2017 |
| WO | 2017223482 A1 | 12/2017 |

OTHER PUBLICATIONS

Li et al "Synthesis of Single Crystal LiNi0.6Mn0.2Co0.2O2 with Enhanced Electrochemical Performance for Lithium Ion Batteries" Journal of the electrochemical society 165(5) A 1038-1045 2018.*
International Search Report, PCT/US2021/034209, dated Dec. 23, 2021, pp. 1-3.

* cited by examiner

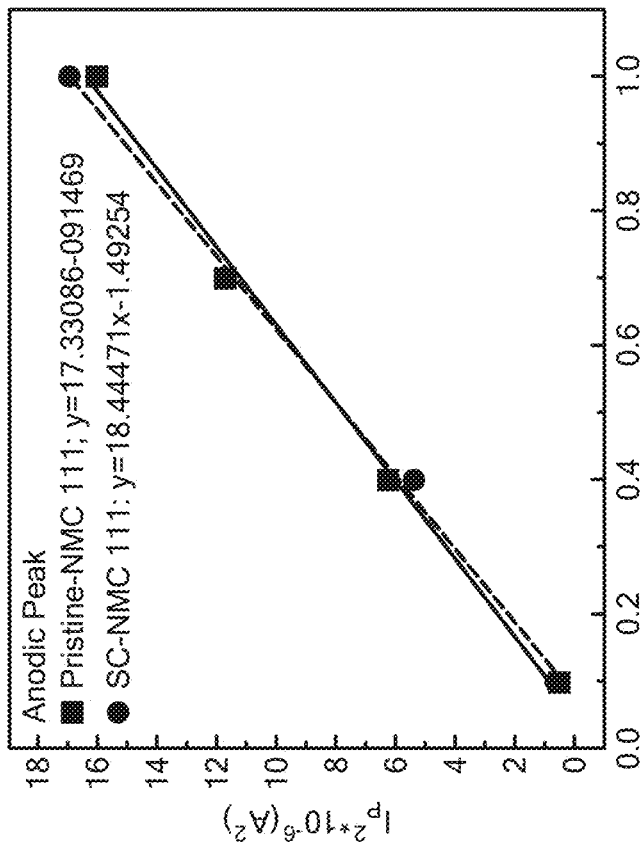
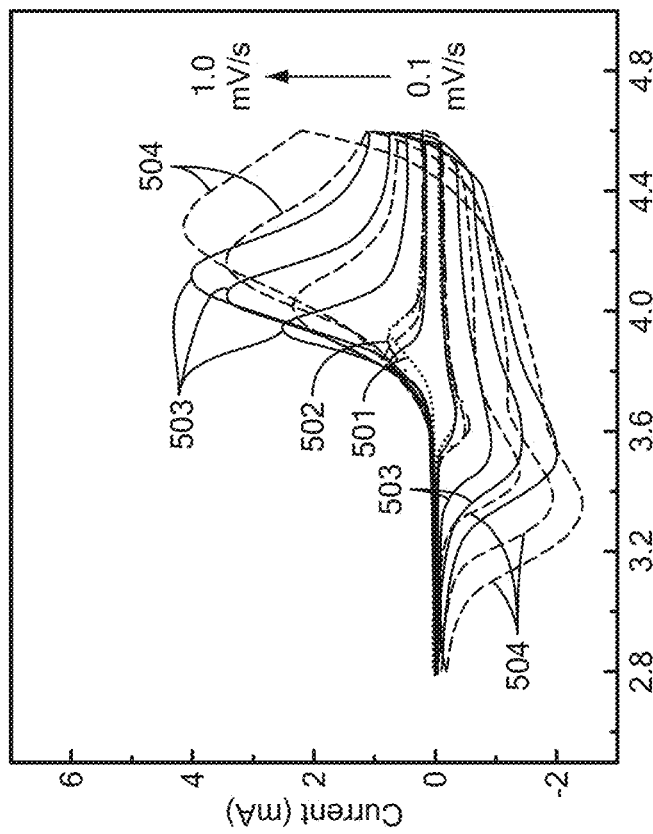
FIG. 5A
FIG. 5B

FACILE ETCHING FOR SINGLE CRYSTAL CATHODE MATERIALS

RELATED APPLICATIONS

This patent application claims the benefit under 35 U.S.C. § 119(e) of U.S. Provisional Patent App. No. 63/030,414, filed May 27, 2020, entitled "FACILE ETCHING FOR SINGLE CRYSTAL CATHODE MATERIALS," incorporated herein by reference in entirety.

STATEMENT REGARDING FEDERALLY FUNDED RESEARCH AND DEVELOPMENT

This invention was made with government support under DE-EE0006250 awarded by the US Department of Energy in conjunction with the US Advanced Battery Consortium (USABC). The government has certain rights in the invention.

BACKGROUND

Li-ion batteries (LIB s) have been widely applied in recent decades, particularly with respect to electric vehicles (EV) and plug-in electric vehicles (PHEV) which have been equipped with or directly powered by LIBs. LIBs have been widely used in portable electronics, electric vehicles and grid storage as dominant power sources. Continued demand for LIB s will result in a constant stream of spent LIB s available for recycling as their host devices reach an end of a useful life cycle.

Widespread use of LIBs results in a corresponding demand of raw materials of LIBs. This drives a consumption of critical metals such as lithium, cobalt and nickel, placing a demand on the overall the geological reserves of these metals. Meanwhile, the end-of-life LIBs accumulate every year. Accordingly, the global market for LIBs recycling is predicted to increase substantially. Further, since spent LIBs contain heavy metals, such as, nickel and cobalt, they are classified as carcinogenic and mutagenic materials, and the organic electrolytes can lead to an adverse effect on human health and environment. Considering the economic and environmental implications, proper handling of spent LIBs is lucrative and productive.

SUMMARY

A recycling and synthesis of charge material from secondary batteries generates single-crystal (SC) charge materials for producing batteries with greater charge cycle longevity. Charge material particles undergo a heating for fusing to produce polycrystalline particles. The resulting, more well-defined grain boundaries are easily etched by a relatively weak mineral acid solution. The acid solution removes material at the grain boundaries to separate secondary particles into primary particles along the grain boundaries. The resulting single crystal (monocrystalline) charge material particles are washed and filtered, and typically re-sintered to accommodate any needed lithium, and result in a charge material with larger surface area, higher lithium diffusivity and lower cation ordering.

Layered lithium transition metal oxides, $LiNi_xMn_yCo_zO_2$ (x+y+z=1, NMC), have been used in electronic devices and electric vehicles since its first introduction in $20^{th}$ century. Due to successful commercialization, a huge number of spent Li-ion batteries with NMC have been produced every year. From both resource and environmental perspectives, recycling spent Li-ion batteries is crucial. Many recycling approaches successfully regenerate new cathode materials with the same composition, structure, and similar electrochemical performance. Here, an innovative facile approach is applied to upgrade polycrystalline $LiNi_{1/3}Mn_{1/3}Co_{1/3}O_2$ cathode material to a high-performance single crystal $LiNi_{1/3}Mn_{1/3}Co_{1/3}O_2$ cathode material by etching. The particle size of obtained single crystal materials is approximately 600-700 nm with a well-ordered crystalline structure. The single crystal particles show an outstanding rate performance, which is ~10% higher than polycrystalline particles, and enhanced capacity retention of ~85% after 300 cycles at 0.5 C. The improvement of single crystal cathode materials in comparison to, for example, polycrystalline NMC 111 is contributed by many factors including a larger surface area, 1.5 times higher lithium diffusion coefficient and 50% lower cation mixing.

Configurations herein are based, in part, on the observation that secondary batteries (rechargeable) such as those common in electric vehicles and battery powered utility equipment benefit when able to withstand repeated charge/discharge cycles over time. Unfortunately, conventional approaches to polycrystalline cathode charge materials in secondary batteries suffer from the shortcoming that cycle capacity is subject to fading from repeated charging, reducing overall longevity as the cathode material degrades and becomes less capable of storage capacity, reducing the electrical energy available in a discharge cycle. Accordingly, configurations herein substantially overcome the above described shortcomings of conventional polycrystalline charge materials by generating single crystal charge materials having greater charge cycle longevity.

The disclosed approach may be used for different polycrystalline cathode materials. NMC cathode materials are employed herein as an example. In conventional lithium ion batteries with polycrystalline NMC materials, cycling capacity fades quickly, especially for Ni-rich NMC cathode materials, because the polycrystalline NMC particles are easily cracked during cycling, which accelerates capacity fading. In addition, secondary particles have the disadvantages of a small surface area and large diffusion distance of lithium diffusion, which also tend to limit the performance.

In further detail, the method for etching charge material for secondary batteries to define single crystal materials includes receiving a charge material quantity including polycrystalline particles defined by grain boundaries, and heating the charge material quantity for enhancing at least a portion of the grain boundaries. A weak acid solution is added to the charge material, in which the acid solution has a predetermined ratio based on a type of the acid in the acid solution for providing an appropriate dissolution strength. Agitation of the charge material quantity with the acid solution etches the grain boundaries remaining following the heating for forming single crystals resulting from the removal of the etched grain boundaries. Useable single crystal charge material is formed by adding additional lithium compounds to accommodate the lost lithium for bringing the lithium ratio to 1.0 molar with the charge material, and sintering with the added lithium compounds for restoring the ratio of lithium.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIGS. 5A-5F show scans of single crystal charge material as defined herein with pristine NMC 111 charge materials.

DETAILED DESCRIPTION

The description below presents an example of the generation of single crystal charge materials from a polycrystalline source of charge materials of either virgin sourced or recycled cathode materials. The examples below depict an NMC (Nickle, Manganese, Cobalt) battery chemistry however other battery formulations and ratios may benefit from the approach disclosed herein.

Figure 1:
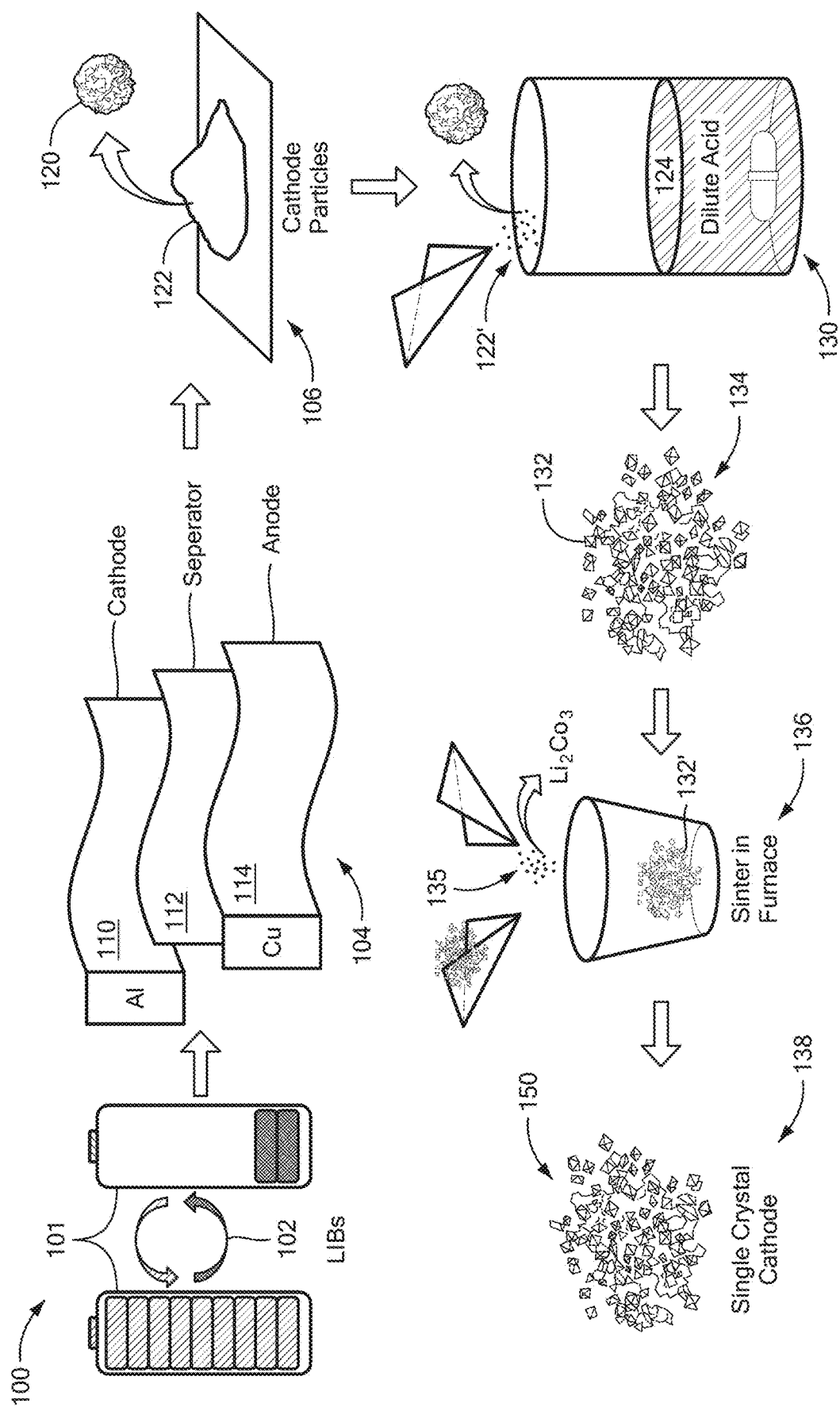
FIG. 1 is a context diagram of a recycling environment suitable for use with configurations herein.

FIG. 1 is a context diagram of a recycling environment suitable for use with configurations herein. Referring to a flow sequence 100 of FIG. 1, the claimed approach overcomes battery longevity and charge capacity problems in the prior art. Deployed lithium-ion batteries (LIBs) 101 undergo a number of charge cycles which ultimately result in unacceptably degraded performance, as shown at step 102. Dismantling of the batteries results in constituent materials including cathode charge materials 110, a separator 112, and anode charge materials 114, shown at step 104. Configurations herein aim to provide a facile method to upgrade traditional cathode particles to high-performance single crystal particles with large surface area and greater Li diffusion coefficient, thereby constituting a lithium secondary battery superior in cycle characteristics as well as rate characteristics.

A general overview of the approach herein includes the following. Cathode particles 120, appearing as a powder form 122 of about 2-3 up to about 10-15 microns, result from physical grinding and agitation of the batteries 101, as depicted at step 106.

The batteries 101 employ polycrystalline cathode charge materials for defining a recycling stream, however virgin or other forms of polycrystalline materials may also benefit from the upgrading as disclosed herein. In a particular arrangement, NMC charge materials in a 1:1:1 ratio are employed (NMC 111), however any suitable ratio and composition may be employed.

The NMC polycrystalline cathode materials 122' are dispersed in a dilute acid 124 and stirred, as shown at step 130. A resulting etched powder 132 was then filtered and washed with deionized water for several times to remove acid residual and dried in an oven, as shown at step 134. The dried powder 132' was mixed with additional $Li_2CO_3$ or LiOH to compensate for losses during etching and washing, and re-sintered, as shown at step 136, and the resulting single crystal cathode materials 150 rendered as a powder suitable for use in new battery construction, disclosed at step 138.

Figure 2B:
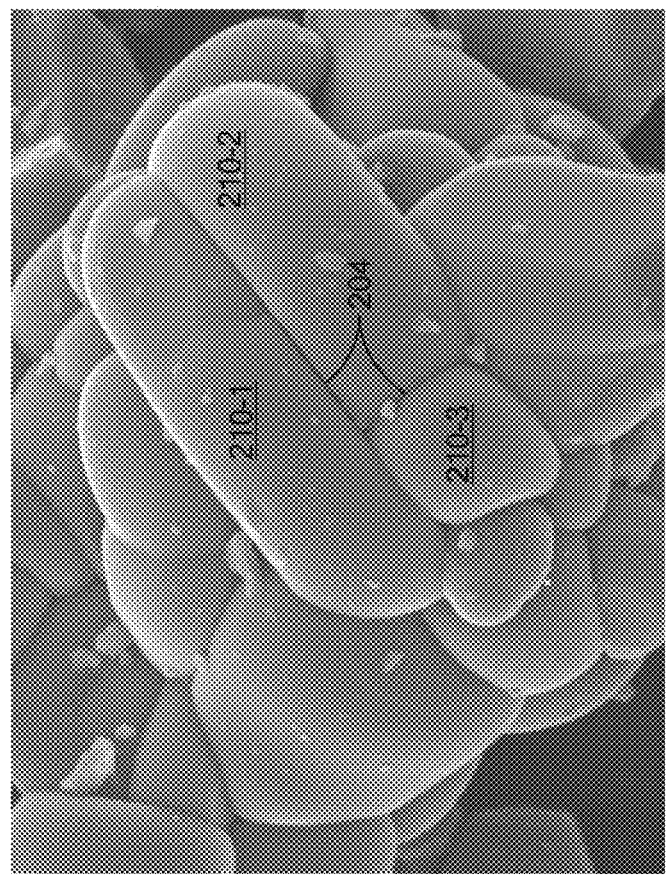
FIGS. 2A and 2B are SEM (Scanning Electron Microscope) images of polycrystal material particle as defined herein.
Figure 2A:
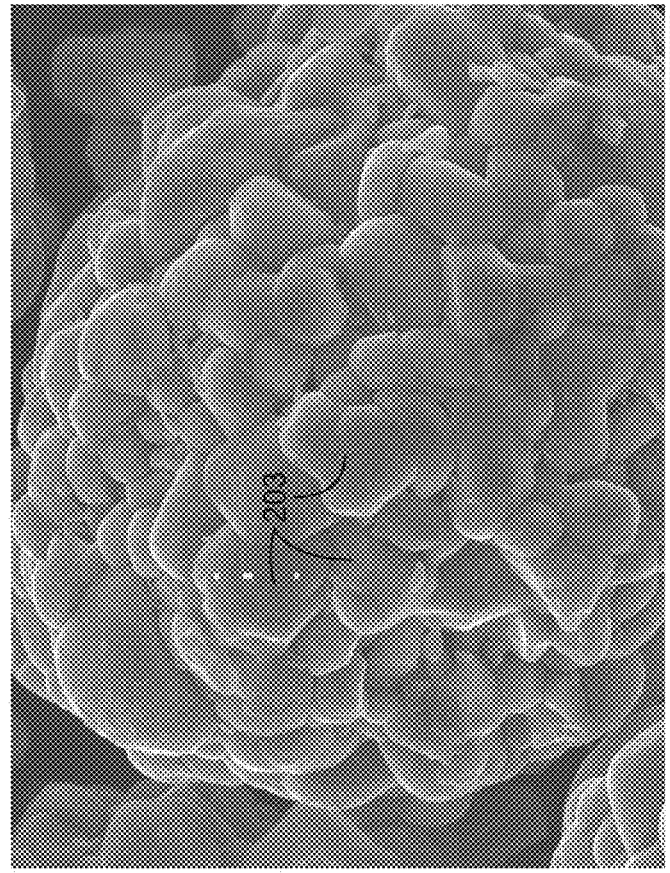

FIGS. 2A and 2B are SEM (Scanning Electron Microscope) images of grain boundaries in a charge material particle as defined herein. Referring to FIGS. 1 and 2, FIG. 2A shows a polycrystalline charge material particle 120. Polycrystalline particles 120 appear as an agglomeration 201 of smaller, primary particles clustered together in an absence of well defined separations 203, where lines separating sub-particles appear to merge or disappear. In contrast, FIG. 2B shows a polycrystalline particle following heating as defined herein, which enhances and grows the grain boundaries 204 into discrete, well delineated separations between subparticles 210-1, 210-2, 210-3 (210 generally). The well defined grain boundaries 204 are responsive to etching with a weak acid to separate the secondary, subparticles 210 into single crystal primary particles. The weak or dilute acid, as will be discussed further below, dissolves the grain boundaries 204.

Figure 3B:
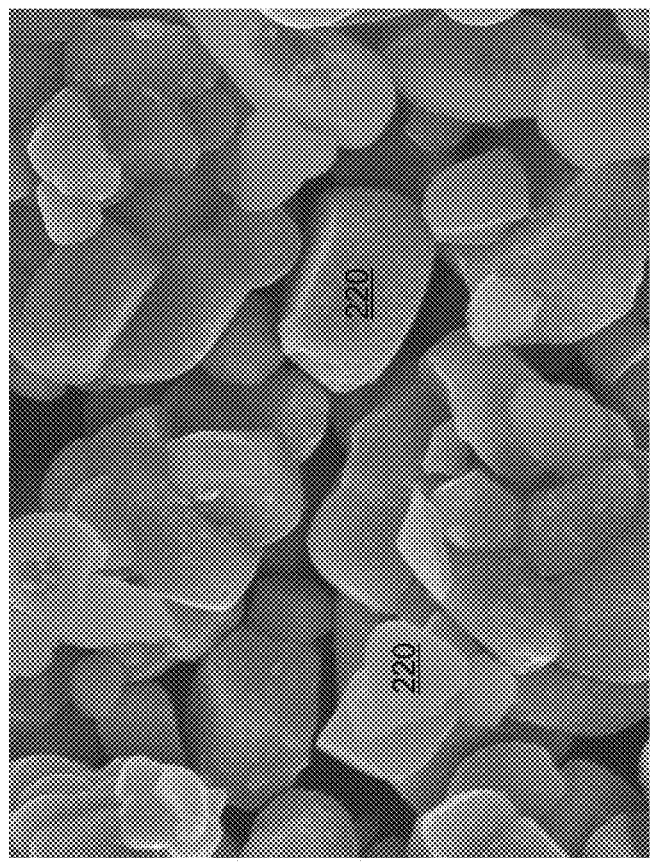
FIGS. 3A and 3B show SEM images of single crystal (monocrystalline) charge material particles.
Figure 3A:
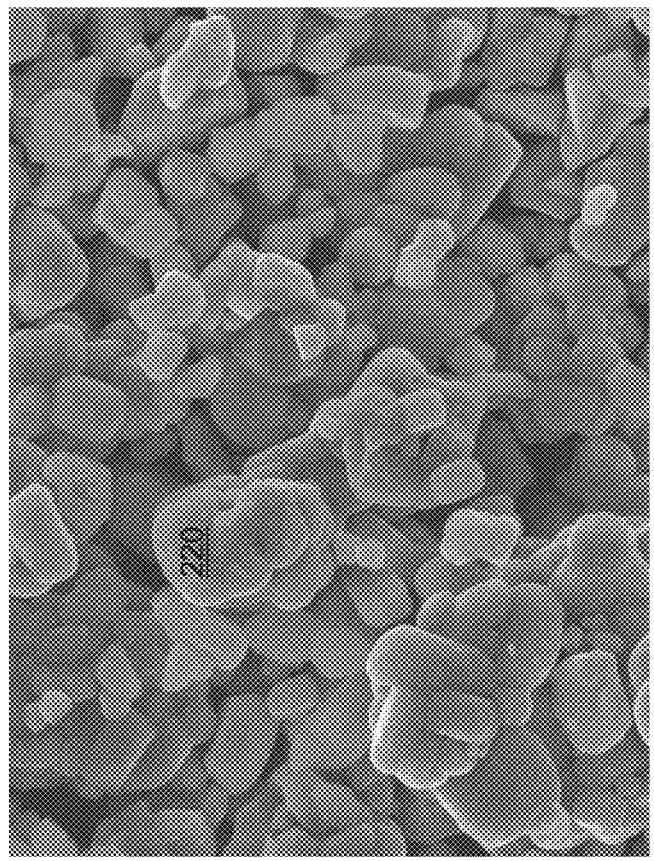

FIGS. 3A and 3B show SEM images of single crystal (monocrystalline) charge material particles. Referring to FIGS. 2A-3B, in FIG. 3A each of the particles is a single crystal primary particle 220 having well defined separations, with few or no grain boundaries denoting secondary particles. FIG. 3B shows a greater magnification of the primary, monocrystalline particles 220

Figure 4:
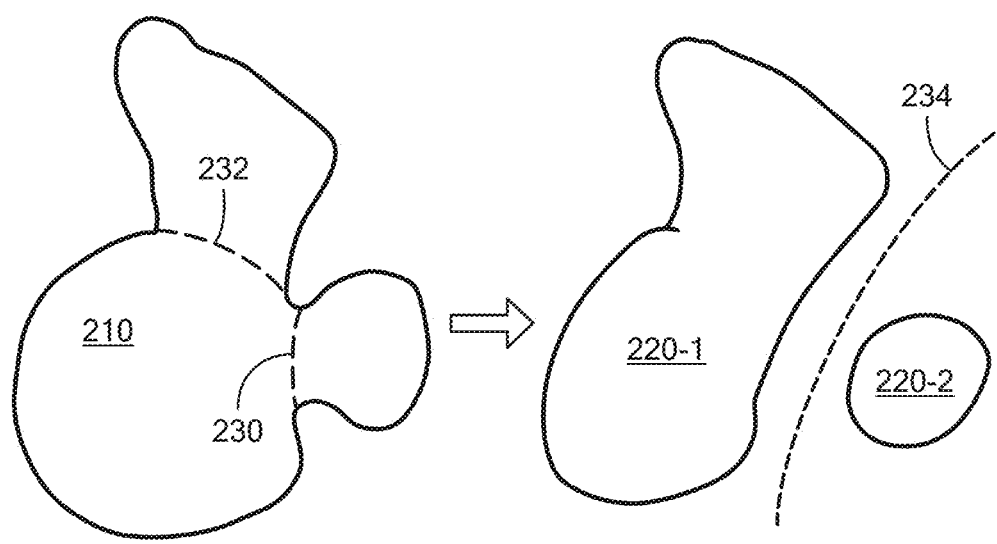
FIG. 4 shows a schematic of forming single crystal materials from polycrystalline charge material particles.

FIG. 4 shows a schematic of forming single crystal materials from polycrystalline charge material particles. Referring to FIGS. 3A, 3B and 4, a polycrystalline particle 210 has a well defined grain boundary, shown by dotted line 230, and a protruding shape defined by a rough surface indicating subtle boundary 232. Following etching, the well defined grain boundary 230 is etched (dissolved) away, resulting in a complete separation 234 of primary particle 220-2. The subtle boundary 232 was not etched away, and remains as primary particle 220-1. Thus, the heating of the polycrystalline cathode material 210 causes grain boundaries to enhance to form more well-defined grain boundaries 204 or combine to fuse grain boundaries. For a more subtle structure or surface aberration, heating the charge material may result in fusing partially defined grain boundaries for withstanding the subsequent etching by the acid solution. In other words, heating enhances or refines the grain boundaries so that the subsequent etching will remove the primary particles at the grain boundaries 204.

Continuing to refer to FIGS. 1-4, a full implementation of upgrading polycrystalline charge materials to single crystal includes receiving a charge material quantity including polycrystalline particles, where the polycrystalline particles 120 are defined by the grain boundaries 204. Prior to etching, an initial heating, or sintering, is performed and the charge material quantity is heated for enhancing at least a portion of the grain boundaries 204.

In the example employed herein, the charge material quantity entering the process is polycrystalline nickel manganese cobalt (NMC) from a recycling stream of spent NMC batteries. However, the charge material quantity may be satisfied by any suitable polycrystalline nickel manganese cobalt (NMC) from a refined virgin source, and alternatively may comprise other battery chemistries.

The initial heating is based on a composition ratio of different charge material compounds in the charge materials. The temperature should be above a range at which polycrystalline versions of the same battery chemistry are formed, typically a temperature elevation is in a range of 50°-60° C. above the polycrystalline forming temperature is sufficient. Heating the charge material enhances the grain boundaries to either fuse or separate the polycrystalline particles by growing the grain boundaries of the polycrystalline particles. For the NMC 111 example, heating includes heating to around 870°-910° C. for forming polycrystalline charge materials with enhanced grain boundaries responsive to subsequent etching.

The heating step therefore further includes identifying, based on the composition ratio, a temperature for forming a polycrystalline form of the charge material quantity, and heating at a temperature elevated above the identified temperature for forming a single crystal form of the charge material quantity, to enhance the grain boundaries for the subsequent etching.

Following the heating, an acid solution is added to the charge material, such that the acid solution has a predetermined ratio based on a type of the acid in the acid solution. Stirring and/or mixing, along with mild heating, is performed for agitating the charge material quantity with the acid solution for etching the grain boundaries remaining following the heating for forming single crystals resulting from the removal of the etched grain boundaries. Heating to around 100° C. facilitates the etching process.

Acid selection for etching strives for a balance to etch the grain boundaries with little to no dissolution of the particle body or mass. A relatively dilute or weak acid solution is selected based on an acidic strength. For example, many of the same acids may be employed in substantially greater concentrations for a leaching of charge material through complete or near complete dissolution. The selected acid is typically a mineral acid including one or more of the following:

Hydrochloric acid HCl
Nitric acid $HNO_3$
Phosphoric acid $H_3PO_4$
Sulfuric acid $H_2SO_4$
Boric acid $H_3BO_3$
Hydrofluoric acid HF
Hydrobromic acid HBr
Perchloric acid $HClO_4$
Hydroiodic acid HI Particularly beneficial results can be found with the following ranges:

| | |
|---|---|
| Hydrochloric acid HCl | 0.01-0.10 g/ml. |
| Nitric acid $HNO_3$ | 0.03-0.13 g/ml. |
| Phosphoric acid $H_3PO_4$ | 0.05-0.15 g/ml. |
| Sulfuric acid $H_2SO_4$ | 0.01-0.10 g/ml. |

The acid solution and strength are selected to at least partially dissolve material at the grain boundaries for forming a primary particle resulting from the etched grain boundary, effectively separating secondary particles 210 at the grain boundaries 204. Once mixed, agitating further comprises stirring the charge material quantity with the acid solution for etching the grain boundaries remaining unfused from heating for separating the polycrystalline particles at the grain boundaries to form single crystalline particles. In other words, the grain boundaries that were enhanced or grown from the heating may now be etched and dissolved rather easily by the acid solution.

Once the single crystal particles are formed, the etched charge material is filtered, washed and dried in preparation for use in new and/or recycled batteries. During the monocrystalline upgrading, a small portion of the lithium is typically lost due to heating and etching. Accordingly, a small quantity (about 5%) of lithium is usually needed to restore the lithium content to an ideal 1.0 molar ratio with the charge material. The etched charge material is therefore sintered with at least one of lithium hydroxide or lithium carbonate for restoring the lithium content to a molar ratio of 1.0. A suitable lithium compound is based on the lithium compound previously sintered with the charge material prior to recycling.

Following washing and drying, a quantity of lithium lost during heating and etching is determined. Additional lithium compounds are added to accommodate the lost lithium for bringing the lithium ratio to 1.0 molar with the charge material, and the lithium balanced charge material is sintered with the added lithium compounds at around 870°-910° C. for restoring the ratio of lithium.

A particularly beneficial implementation of the above approach provides a method for generating a single crystal NMC (nickel, manganese cobalt) charge material from exhausted polycrystalline NMC charge materials from a waste stream of secondary batteries. This includes receiving spent materials resulting from a recycling stream to gather exhausted polycrystalline NMC charge materials, such that the polycrystalline NMC charge materials for recycling were previously formed from sintering with at least one of lithium carbonate or lithium hydroxide. These spent charge materials from the recycling stream are heated in a range between 700°-950° C. to grow the grain boundaries, as shown above in FIGS. 2-4. Facile etching is performed on the spent material using dilute sulfuric acid to produce etched NMC charge materials. This results in the polycrystalline particles of the charge material quantity defined by subparticles bound at grain boundaries being dissolved, such that the single crystalline particles formed from the etched removal of material at the grain boundaries.

Washing and drying the etched NMC charge materials removes impurities and residue, and a charge material slightly depleted of lithium results, due to lithium lost in heating and etching. Accordingly, additional lithium carbonate is added to the etched NMC charge materials based on a molar ratio of the polycrystalline NMC charge materials gathered from the waste stream. This purports to recover a similar ratio of NMC charge materials, such as 111, 811, 622, or other suitable ratio. A final sintering of the etched NMC charge materials with the added lithium carbonate generates a single crystal NMC charge material based on the molar ratio (note that the molar ratio of lithium to charge material, and the ratio of the constituent NMC charge materials to each other define two different composition factors).

Figure 5C:
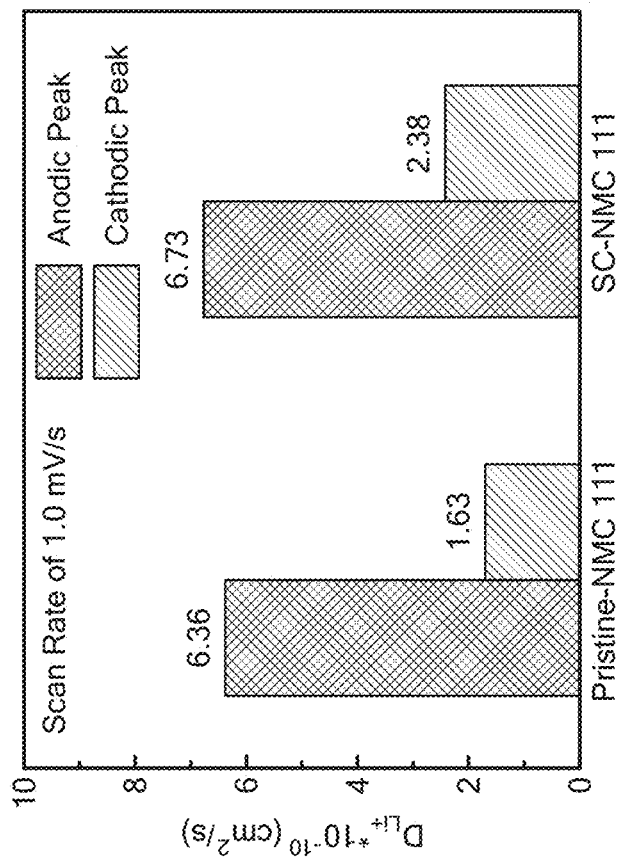
Figure 5D:
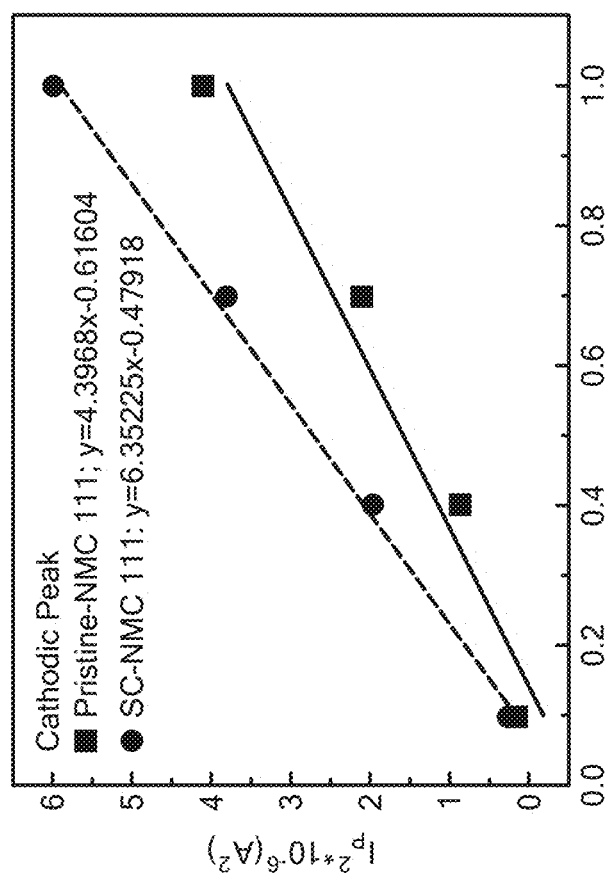

FIGS. 5A-5F show scans of single crystal charge material as defined herein with pristine NMC 111 charge materials. Referring to FIGS. 5A-5F, CV spectra of Pristine-NMC 111 (501, 503) and SC-NMC 111 (502, 504) using different scan rates from 0.1 mV/s to 1.0 mV/s are shown. In FIG. 5A, a plot between peak current ($I^{(2/p)}$) and scan rate (v) for anionic peak (FIG. 5B) is shown. FIG. 5C shows a cathodic peak. FIG. 5D depicts a Li diffusion coefficient value ($D_{Li}+$). An EIS curve of fresh cell vs. 200 cycles for Pristine-NMC 111 is shown in FIG. 6E and FIG. 6F shows SC-NMC 111.

In order to determine Li diffusivity, different CV scan rates are analyzed from 0.1 mV/s to 1.0 mV/s when applying potential between 2.8 and 4.6 V (vs. Li/Li$^+$). FIG. 5A displays the resulted CV curves for both samples, and FIGS. 5B and 5C illustrate corresponding plots between peak current (I") and scan rate (v). The slope of $I^{(2/p)}$) vs. v is proportional to Li diffusion; the steeper the slope, the higher Li diffusivity is. For the anodic peak, an insignificant slope difference between Pristine-NMC 111 and SC-NMC 111 is observed since it is more facile for Li ions to diffuse out of the structure during charging compared to cathodic peak; the Li layer shrinks and requires more effort (increase in charge-transfer resistance) for lithiation process during discharging. Notably, SC-NMC 111 has a slightly larger polarization compared to Pristine-NMC 111 as the peak of oxidation reaction occurs at higher voltage. This is related to the particle size of SC-NMC 111 in nano range whereas Pristine-NMC 111 is in micro range causing higher surface area in contact with electrolyte.

The peak around 3.9 V and around 3.7 V represent oxidation and reduction reaction of Ni ($Ni^{2+}/Ni^{4+}$) and Co ($Co^{3+}/Co^{4+}$), respectively. These distinct anodic (oxidation) and cathodic (reduction) peaks are used to determine Li diffusion coefficient ($D_{Li+}$) using the below equation (Randles-Sevcik equation) where n is the number of electrons transfer per reaction (in this case n=1), A is the electrode surface area (1.13 $cm^2$ in this work) and C is the bulk concentration of Li-ion on the electrode. As per assumption, all electrode area is saturated with electrolyte and electrode surface area is used instead of BET.

$$I_p^2 = (2.69 * 10^5)^2 n^3 A^2 D_{Li+} VC$$

Figures 5E, 5F:
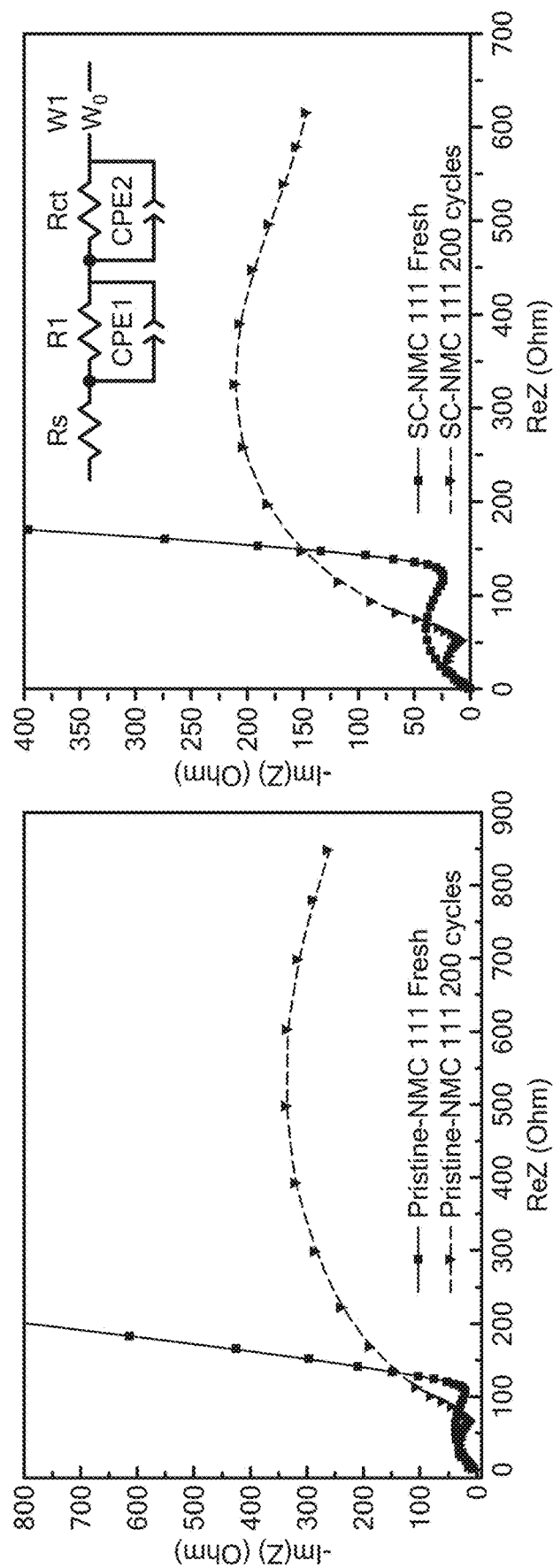

According to the above equation and peak current from FIGS. 5B and 5C plot, $D_{Li+}$ is calculated based on a scan rate of 1.0 mV/s due to the fastest rate and the most prominent I". The $D_{Li+}$ of anodic peak for Pristine-NMC 111 and SC-NMC 111 (FIG. 5D) are $6.36 \times 10^{-10}$ $cm^2/s$ and $6.73 \times 10^{-10}$ $cm^2/s$, whereas the $D_{Li+}$ of cathodic peak are $1.63 \times 10$ cm/s and $2.38 \times 10$ cm/s (~1.5 times greater), respectively. Evidently, SC-NMC 111 improves the $Li^+$ diffusivity which is consistent with refinement data and electrochemical performance. Remarkedly, SC-NMC 111 has a broader signal compared to Pristine-NMC 111 which attributes to the larger anodic and cathodic polarization from increasing surface area as supported by SEM and TEM images. The electrochemical impedance spectroscopy (EIS) was investigated to further understand the increased electrochemical performance. FIGS. 5E and 5F show the EIS spectra of SC-NMC 111 and Pristine-NMC 111 before and after cycles (fresh means that batteries were tested before cycle). RSEI is resistance of the SEI layer and $R_{ct}$ is the charge transfer resistance in the coin cell system. All resistance values increase after 200 cycles of charge and discharge. However, after 200 cycles, all resistance values of SC-NMC 111 are lower than Pristine-NMC 111, which indicated that SC-NMC 111 has a better structural stability. Also, 40% lower $R_{ct}$ of SC-NMC 111 provides partial contribution for high capacity as it reduces the energy barrier for ions diffusion between the electrode and the electrolyte. We note that RSEI of the fresh cell for SC-NMC 111 is slightly larger than Pristine-NMC 111. This may due to the smaller particle size of SC-NMC 111 that allows greater possibility for the particle surface to contact and react.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. A method for etching charge material for secondary batteries, comprising:
    heating a charge material quantity including polycrystalline particles, the polycrystalline particles defined by grain boundaries;
    adding an acid solution to the charge material quantity, the acid solution having a predetermined ratio based on a type of the acid in the acid solution; and
    agitating the charge material quantity with the acid solution for etching the grain boundaries remaining following the heating for forming single crystals resulting from the removal of the etched grain boundaries.

2. The method of claim 1 further comprising, prior to adding the acid solution to the charge material quantity, heating the charge material quantity for enhancing at least a portion of the grain boundaries.

3. The method of claim 2 wherein heating the charge material quantity fuses the polycrystalline particles by growing the grain boundaries of the polycrystalline particles.

4. The method of claim 2 further comprising sintering with at least one of lithium hydroxide or lithium carbonate for restoring the lithium content to a molar ratio of around 1.0.

5. The method of claim 2 further comprising:
    determining a quantity of lithium lost during heating;
    adding additional lithium compounds to accommodate the lost lithium for bringing the lithium ratio to 1.0 molar with the charge material; and
    sintering with the added lithium compounds at around 870°-910° C. for restoring the lithium ratio in the single crystal charge material.

6. The method of claim 1 wherein the polycrystalline particles of the charge material quantity are defined by subparticles bound at grain boundaries, the single crystalline particles formed from the etched removal of material at the grain boundaries.

7. The method of claim 1 wherein agitating the charge material quantity with the acid solution further includes heating to 100° C. during the etching step.

8. The method of claim 1 wherein heating the charge material quantity results in fusing partially defined grain boundaries for withstanding the subsequent etching by the acid solution.

9. The method of claim 2 wherein agitating further comprises stirring the charge material quantity with the acid solution for etching the grain boundaries remaining unfused from heating for separating the polycrystalline particles at the grain boundaries to form single crystalline particles.

10. The method of claim 1 wherein the charge material quantity is polycrystalline nickel manganese cobalt (NMC) from a recycling stream of spent batteries.

11. The method of claim 1 wherein the charge material quantity is polycrystalline nickel manganese cobalt (NMC) from a refined virgin source.

12. The method of claim 3 wherein the heating is performed at a temperature based on a composition ratio of different charge material compounds in the charge materials.

13. The method of claim 12 wherein the heating further comprises:
    identifying, based on the composition ratio, a temperature for forming a polycrystalline form of the charge material quantity; and
    heating at a temperature elevated above the identified temperature for forming a single crystal form of the charge material quantity to enhance the grain boundaries to either fuse or separate the polycrystalline form by growing grain boundaries of the polycrystalline form.

14. The method of claim 13 wherein the temperature elevation is in a range of 50°-60° C. above the polycrystalline forming temperature.

15. The method of claim 13 wherein the heating includes heating to around 870°-910° C. for forming polycrystalline charge materials with enhanced grain boundaries responsive to subsequent etching.

16. The method of claim 2 wherein the heating causes grain boundaries to enhance to form more well-defined grain boundaries or combine to fuse grain boundaries.

17. The method of claim 6 wherein the acid solution at least partially dissolves material at the grain boundaries for forming a primary particle resulting from the etched grain boundary.

18. The method of claim 1 wherein the acid solution is a dilute mineral acid solution.

19. The method of claim 1 wherein the acid solution includes a dilute solution of an acid selected from the group consisting of:

hydrochloric, nitric, phosphoric, sulfuric, boric, hydrofluoric, hydrobromic, perchloric and hydroiodic.

20. The method of claim 1 wherein the acid solution is hydrochloric acid having a range of between 0.01-0.10 g/ml.

21. The method of claim 1 wherein the acid solution is sulfuric acid having a range of between 0.01-0.10 g/ml.

22. The method of claim 1 wherein the acid solution is phosphoric acid having a range of between 0.05-0.15 g/ml.

23. The method of claim 1 wherein the acid solution is nitric acid having a range of between 0.03-0.13 g/ml.

24. A method for generating a single crystal NMC (nickel, manganese cobalt) charge material from exhausted polycrystalline NMC charge materials received from a waste stream of secondary batteries, comprising:

receiving spent materials resulting from the exhaust stream of the exhausted polycrystalline NMC charge materials, the polycrystalline NMC charge materials formed from sintering with at least one of lithium carbonate or lithium hydroxide;

heating the spent materials from the recycling stream at between 700°-950° C. to grow the grain boundaries;

facile etching the spent material in dilute sulfuric acid to produce etched NMC charge materials;

washing and drying the etched NMC charge materials;

adding additional lithium carbonate to the etched NMC charge materials based on a molar ratio of the polycrystalline NMC charge materials gathered from the waste stream; and sintering the etched NMC charge materials with the added lithium carbonate to generate a single crystal NMC charge material based on the molar ratio.

* * * * *